(12) United States Patent
Hong et al.

(10) Patent No.: US 11,430,851 B2
(45) Date of Patent: Aug. 30, 2022

(54) DISPLAY DEVICE HAVING STRETCHABLE SUBSTRATE

(71) Applicant: SAMSUNG DISPLAY CO., LTD., Yongin-si (KR)

(72) Inventors: Jong Ho Hong, Yongin-si (KR); Jun Hyeong Park, Yongin-si (KR); Jae Min Shin, Yongin-si (KR); Hye Jin Joo, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/793,348

(22) Filed: Feb. 18, 2020

(65) Prior Publication Data

US 2020/0185488 A1 Jun. 11, 2020

Related U.S. Application Data

(63) Continuation of application No. 16/149,513, filed on Oct. 2, 2018, now Pat. No. 10,608,071.

(30) Foreign Application Priority Data

Mar. 26, 2018 (KR) .......................... 10-2018-0034642

(51) Int. Cl.
*H01L 29/08* (2006.01)
*H01L 35/24* (2006.01)
(Continued)

(52) U.S. Cl.
CPC ...... *H01L 27/3276* (2013.01); *H01L 27/3216* (2013.01); *H01L 27/3218* (2013.01); *H01L 27/3246* (2013.01); *H01L 27/3258* (2013.01); *H01L 27/3262* (2013.01); *H01L 51/5206* (2013.01); *H01L 51/5253* (2013.01); *H01L 27/124* (2013.01); *H01L 27/1248* (2013.01); *H01L 2251/5338* (2013.01)

(58) Field of Classification Search
CPC ............. H01L 27/3276; H01L 27/3262; H01L 27/3246; H01L 27/3258; H01L 27/3218; H01L 27/3216; H01L 51/5253; H01L 51/5206; H01L 27/124; H01L 2251/5338; H01L 27/1248

See application file for complete search history.

(56) References Cited

U.S. PATENT DOCUMENTS 9,391,286 B1 7/2016 Kwon et al.
9,799,708 B2 10/2017 Hong et al.
(Continued)

FOREIGN PATENT DOCUMENTS

KR 1020180045968 A 5/2018

*Primary Examiner* — Ismail A Muse
(74) *Attorney, Agent, or Firm* — Cantor Colburn LLP

(57) ABSTRACT

A display device includes: a substrate on which a plurality of islands and a plurality of bridges connecting the plurality of islands to each other are defined; a plurality of pixels disposed in each of the plurality of islands; and a wire disposed in each of the plurality of bridges and connected to the plurality of pixels, where the plurality of islands and the plurality of bridges are defined based on cutout portions of the substrate, and a vertex of a cutout portion between one of the plurality of islands and a bridge connected to the one of the plurality of islands is an intersection of a straight line and a curved line.

25 Claims, 11 Drawing Sheets

(51) Int. Cl.
  *H01L 51/00* (2006.01)
  *H01L 27/32* (2006.01)
  *H01L 51/52* (2006.01)
  *H01L 27/12* (2006.01)

(56) References Cited

U.S. PATENT DOCUMENTS

| | | |
|---|---|---|
| 10,026,721 B2 | 7/2018 | Kim et al. |
| 2007/0122590 A1 | 5/2007 | Lalvani |
| 2010/0330338 A1 | 12/2010 | Boyce et al. |
| 2016/0260927 A1* | 9/2016 | Oh ..................... H01L 51/0097 |
| 2016/0268352 A1* | 9/2016 | Hong ................... H01L 51/0097 |
| 2016/0320878 A1 | 11/2016 | Hong et al. |
| 2018/0046221 A1 | 2/2018 | Choi et al. |
| 2018/0090699 A1 | 3/2018 | Shin et al. |
| 2018/0114825 A1* | 4/2018 | Hong ..................... H01L 27/326 |

* cited by examiner

DISPLAY DEVICE HAVING STRETCHABLE SUBSTRATE

This application is a continuation of U.S. patent application Ser. No. 16/149,513, filed on Oct. 2, 2018, which claims priority to Korean Patent Application No. 10-2018-0034642, filed on Mar. 26, 2018, and all the benefits accruing therefrom under 35 U.S.C. § 119, the content of which in its entirety is herein incorporated by reference herein.

BACKGROUND

1. Field

An aspect of the disclosure relates to a display device.

2. Description of the Related Art

Currently, widely known display devices include a liquid crystal display ("LCD"), a plasma display panel ("PDP"), an organic light emitting diode ("OLED") display, a field effect display ("FED"), an electrophoretic display, and the like.

The OLED display may have a reduced thickness and weight since it has a self-luminance characteristic and does not require an additional light source unlike an LCD. In addition, the OLED display is receiving attention as the next generation display device since it features high quality characteristics, such as low power consumption, high luminance, and high response speed.

Recently, a bendable, foldable, or extensible display device has been developed. Particularly, in a stretchable display device, since light emitting elements are formed on a stretchable substrate, when the stretchable substrate is stretched, the light emitting elements or wires stacked on an upper portion of the stretchable substrate may be damaged.

SUMMARY

An exemplary embodiment of the invention provides an organic light emitting diode ("OLED") display in which a light emitting element stacked on a stretchable substrate is effectively prevented from being damaged even though the stretchable substrate is repeatedly extended or contracted.

An exemplary embodiment of the invention further provides an OLED display in which a wire is effectively prevented from being shorted even though the stretchable substrate is repeatedly extended or contracted.

According to an embodiment of the disclosure, a display device includes: a substrate on which a plurality of islands and a plurality of bridges connecting the plurality of islands to each other are defined; a plurality of pixels disposed in each of the plurality of islands; and a wire disposed in each of the plurality of bridges and connected to the plurality of pixels, where the plurality of islands and the plurality of bridges are defined based on cutout portions of the substrate, and a vertex of a cutout portion between one of the plurality of islands and a bridge connected to the one of the plurality of islands is an intersection of a straight line and a curved line.

In an embodiment, the straight line may be a part of edges of the one of the plurality of islands, and the curved line may be a part of edges of the bridge connected to the one of the plurality of islands.

In an embodiment, each of the plurality of islands may be divided into a first area, an edge area surrounding the first area, and a second area located outside of the edge area.

In an embodiment, the display device may further include a first inorganic insulating layer, a second inorganic insulating layer, a third inorganic insulating layer, and a fourth inorganic insulating layer sequentially stacked one on another on the plurality of islands; and a first organic insulating layer covering a part of the fourth inorganic insulating layer and the plurality of bridges.

In an embodiment, the part of the fourth inorganic insulating layer may overlap a remaining area of each of the plurality of islands except the edge area.

In an embodiment, the first organic insulating layer may include an opening corresponding to the edge area.

In an embodiment, the display device may further include an encapsulation layer filling at least a portion of the opening of the first organic insulating layer.

In an embodiment, the fourth inorganic insulating layer may contact the encapsulation layer in at least a part of the edge area.

In an embodiment, each of the plurality of pixels may include a light emitting device; and a transistor which controls an amount of a current flowing through the light emitting device.

In an embodiment, the light emitting device may include a first pixel electrode on the first organic insulating layer, an emission layer on the first pixel electrode, and a second pixel electrode on the emission layer, and the second pixel electrode may fill at least a portion of an opening of the first organic insulating layer defined therein to correspond to the edge area.

In an embodiment, the second pixel electrode may contact the fourth inorganic insulating layer in at least a part of the edge area.

In an embodiment, the display device may further comprise a pixel definition layer defining a light emitting region of each of the plurality of pixels; and a spacer on the pixel definition layer. In such an embodiment, the pixel definition layer may be disposed on the first organic insulating layer in the plurality of the islands.

In an embodiment, the spacer may be located in the second area.

In an embodiment, the light emitting region may be located in the first area.

In an embodiment, the plurality of pixels may include a first pixel which displays a first color, a second pixel which displays a second color, and a third pixel which displays a third color.

In an embodiment, a light emitting region of the second pixel may be located between a light emitting region of the first pixel and a light emitting region of the third pixel.

In an embodiment, an area of a light emitting region of the second pixel may be greater than an area of a light emitting region of the first pixel or the third pixel.

In an embodiment, a shape of a light emitting region of the first pixel may be the same as a shape of a light emitting region of the third pixel.

In an embodiment, the display device may further include a contact electrode disposed on the first organic insulating layer and spaced apart from the first pixel electrode. In such an embodiment, the second pixel electrode may be disposed on the contact electrode in a way such that at least a part of the contact electrode contacts the second pixel electrode.

In an embodiment, the contact electrode may be located in the second area.

In an embodiment, the contact electrode may be located in the first area.

In an embodiment, the contact electrode may be electrically connected to the wire extending from the bridge to the island.

In an embodiment, the display device may further include a second organic insulating layer on the bridge. In such an embodiment, in the bridge, the wire may be disposed on the second organic insulating layer, and in the bridge, the first organic insulating layer may be disposed on the wire and the second organic insulating layer.

In an embodiment, at least a part of the wire located in the bridge may have a curved shape.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
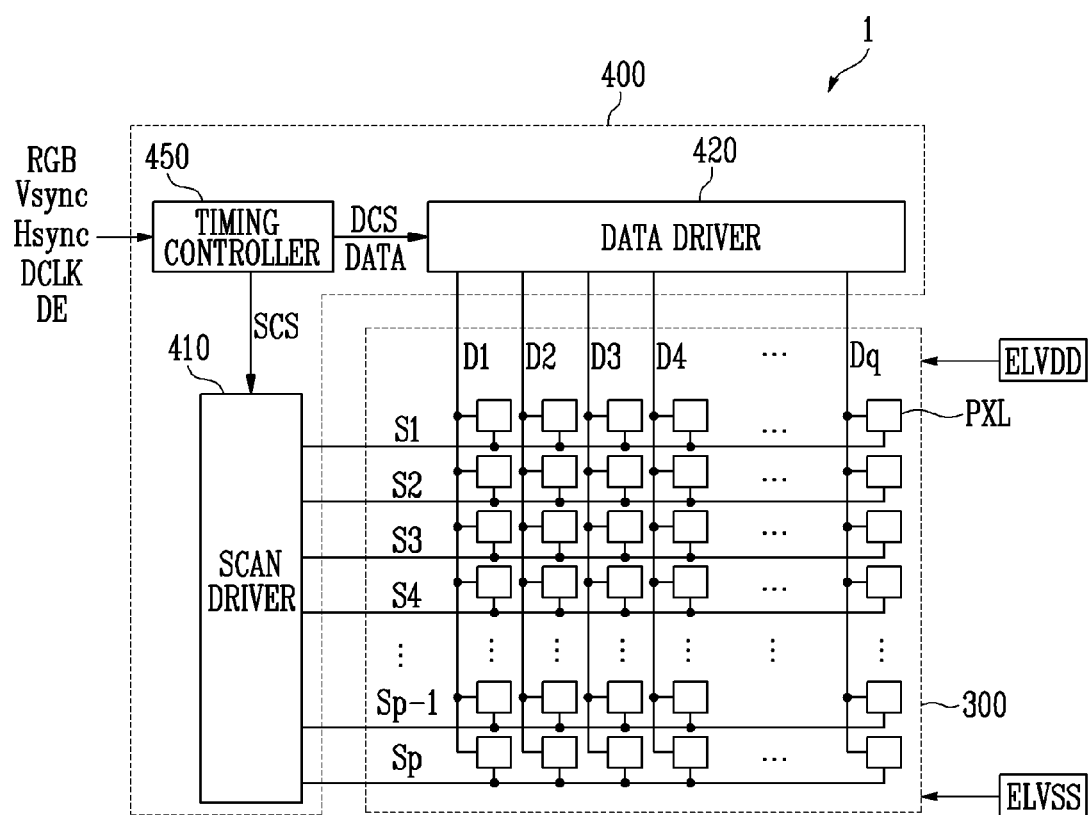
FIG. 1 is a block diagram schematically illustrating a configuration of an organic light emitting device (OLED) display according to an exemplary embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. In this disclosure below, when one part (or element, device, etc.) is referred to as being 'connected' to another part (or element, device, etc.), it should be understood that the former can be 'directly connected' to the latter, or 'electrically connected' to the latter via an intervening part (or element, device, etc.). In order to clarify the invention, parts not related to the description are omitted from the drawings, and the same reference numbers are used throughout the drawings to refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display according to the invention will be described in detail with reference to the accompanying drawings.

FIG. 1 is a block diagram schematically illustrating a configuration of an organic light emitting diode ("OLED") display according to an exemplary embodiment of the invention.

Referring to FIG. 1, an exemplary embodiment of an OLED display 1 according to the invention may include a display panel 300 and a display driver 400.

The display panel 300 may include a plurality of pixels PXL, a plurality of data lines D1 to Dq connected to the pixels PXL, and a plurality of scan lines S1 to Sp connected to the pixels PXL.

Each of the pixels PXL may respectively a data signal and a scan signal through a corresponding data line of the data lines D1 to Dq and a corresponding scan line of the scan lines S1 to Sp.

In such an embodiment, the pixels PXL may be connected to a first power ELVDD and a second power ELVSS.

Each of the pixels PXL may include a light emitting element (e.g., an organic light emitting diode), and may generate light corresponding to a data signal by a current flowing from the first power ELVDD via the light emitting element to the second power ELVSS.

The display driver 400 may include a scan driver 410, a data driver 420, and a timing controller 450.

The scan driver 410 may supply scan signals to the scan lines S1 to Sp in response to a scan driver control signal SCS. In one exemplary embodiment, for example, the scan driver 410 may sequentially supply the scan signals to the scan lines S1 to Sp.

The scan driver 410 may be disposed, e.g., mounted directly, on a substrate on which the pixels PXL are disposed, or may be connected to a substrate through a separate element, such as a flexible circuit board, for connection with the scan lines S1 to Sp.

The data driver 420 may receive a data driver control signal DCS and image data DATA from the timing controller 450 to generate the data signal.

The data driver 420 may supply the generated data signal to the data lines D1 to Dq.

The data driver 420 may be disposed, e.g., mounted directly, on a substrate on which the pixels PXL are disposed, or may be connected to a substrate through a separate constituent element, such as a flexible circuit board, for connection with the data lines D1 to Dq.

When a scan signal is supplied to a specific scan line, some of the pixels PXL connected to the specific scan line may receive a data signal transmitted from the data lines D1 to Dq, and such pixels PXL may emit light with a luminance corresponding to the received data signal.

The timing controller 450 may generate control signals for controlling the scan driver 410 and the data driver 420.

In one exemplary embodiment, for example, the control signals may include the scan driver control signal SCS for controlling the scan driver 410, and the data driver control signal DCS for controlling the data driver 420.

The timing controller 450 may generate the scan driver control signal SCS and the data driver control signal DCS based on an external input signal.

In one exemplary embodiment, for example, the external input signal may include a dot clock DCLK, a data enable signal DE, a vertical synchronization signal Vsync, and a horizontal synchronization signal Hsync.

In an exemplary embodiment, the timing controller 450 may supply the scan driver control signal SCS to the scan driver 410 and the data driver control signal DCS to the data driver 420.

The timing controller 450 may convert external image data RGB inputted from an outside into image data DATA corresponding to specifications of the data driver 420, and may supply the image data DATA to the data driver 420.

The data enable signal DE may define a period during which effective data is inputted, and one period may be set to correspond to one horizontal period such as a period of the horizontal synchronizing signal Hsync.

In an exemplary embodiment, as shown in FIG. 1, the scan driver 410, the data driver 420, and the timing controller 450 are separately provided, but not being limited thereto. Alternatively, at least some of the scan driver 410, the data driver 420, and the timing controller 450 may be integrated.

In an exemplary embodiment, the scan driver 410, the data driver 420, and the timing controller 450 may be installed in various ways such as a chip-on-glass ("COG"), a chip-on-plastic ("COP"), a tape carrier package ("TCP") or a chip-on-film ("COF"), for example.

Figure 2:
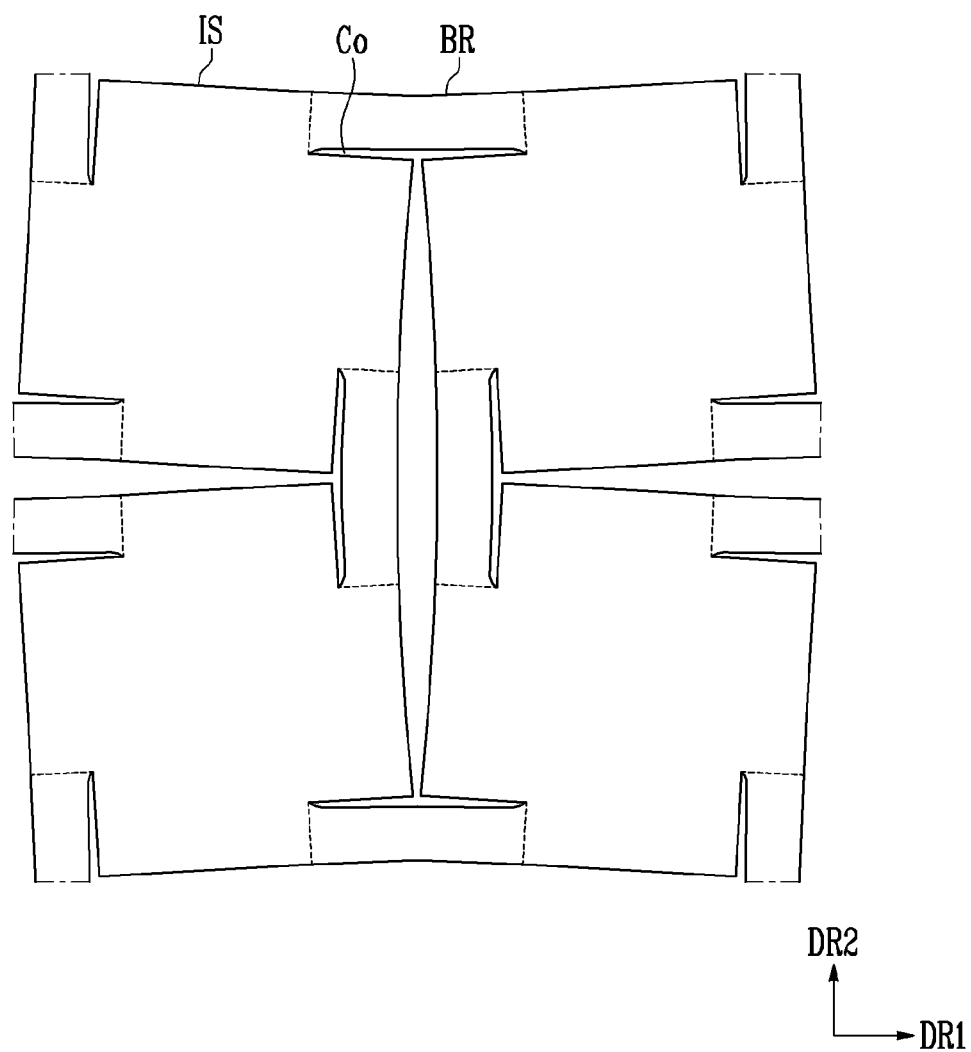
FIGS. 2 and 3 are diagrams illustrating a part of a substrate included in an OLED display according to an exemplary embodiment of the invention.
Figure 3:
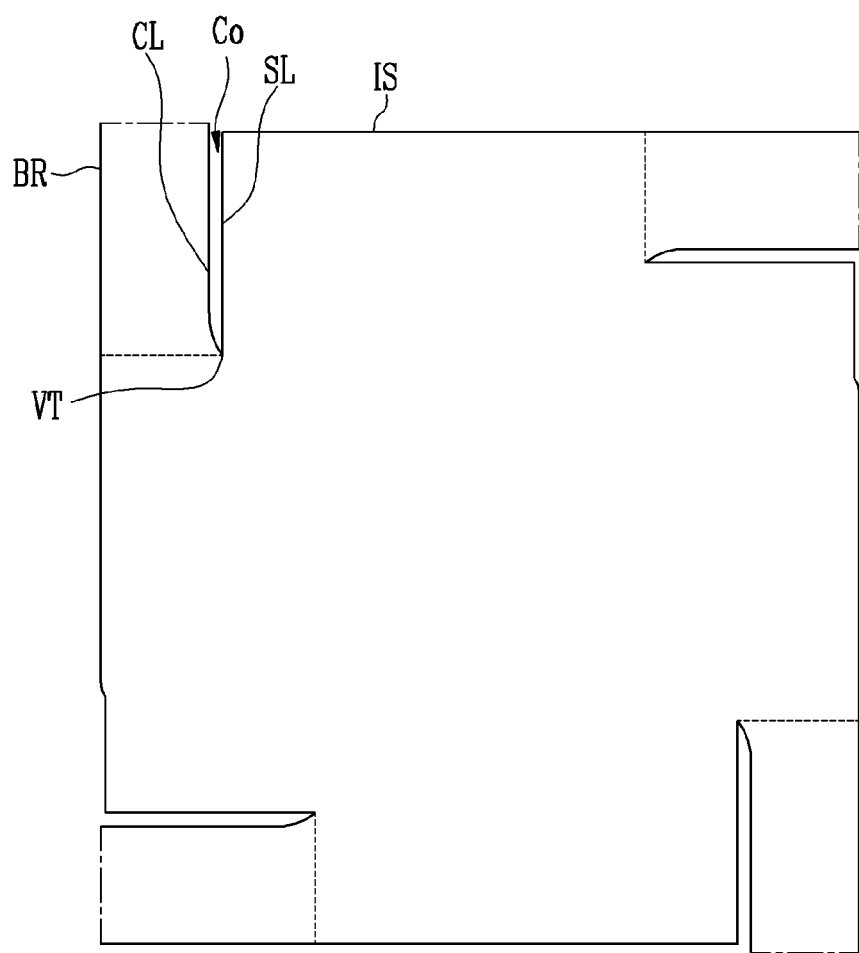

FIGS. 2 and 3 are diagrams illustrating a part of a substrate included in an OLED display according to an exemplary embodiment of the invention. FIG. 3 is a diagram illustrating a shape of an island and bridges connected to the island when a substrate 110 (shown in FIG. 5) is not stretched.

In an exemplary embodiment, the substrate 110 may have a structure supporting the pixels PXL and the like disposed thereon, and may be extended or contracted in a direction as a stretchable substrate.

In an exemplary embodiment, the substrate may include or be made of an insulating material such as resin, or the like. In such an embodiment, the substrate may be made of a material having flexibility to be bent or folded, and may have a single-layer structure or a multi-layer structure.

In one exemplary embodiment, for example, the substrate 110 may include at least one selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Referring to FIGS. 2 and 3, the substrate 110 may include islands IS and bridges BR defined or separated by a cutout portion Co. The cutout portion Co may be an opening formed by removing a part of the substrate 110. In an exemplary embodiment, the substrate 110 may have a shape in which the islands IS and the bridges BR connected to edges of each island IS are arranged along a first direction DR1 and a second direction DR2.

Referring to FIGS. 2 and 3, a vertex VT of the cutout portion Co located between the island IS and the bridge BR may be an intersection of a straight line SL and a curve CL. The straight line SL may be a part of the edges of the island IS, and the curve CL may be a part of the edges of the bridge BR.

A pixel structure (e.g., a thin film transistor, a capacitor, an OLED, or the like) may be disposed or formed on each island IS, and a single pixel PXL or a plurality of pixels PXL may be disposed or formed thereon.

Wires for supplying a power source voltage, a data signal, a scan signal, and the like to the pixel structure may be disposed or formed on each bridge BR.

In such an embodiment, when the substrate 110 is stretched, the bridges BR may be stretched, and a distance between the islands IS may be increased or decreased. In such an embodiment, an area of the cutout portion Co may be increased. However, the shape of each island IS may not be changed.

In such an embodiment, where the shape of each island IS is not changed, a width and a height of the island IS may be constantly maintained or not be increased or decreased when the substrate 110 is stretched. Therefore, a structure of the pixel PXL disposed on the island IS may not be changed.

The entire substrate 110 may have, but not limited thereto, a stretchable structure, or at least a part of the substrate 110 may be stretchable.

Figure 4:
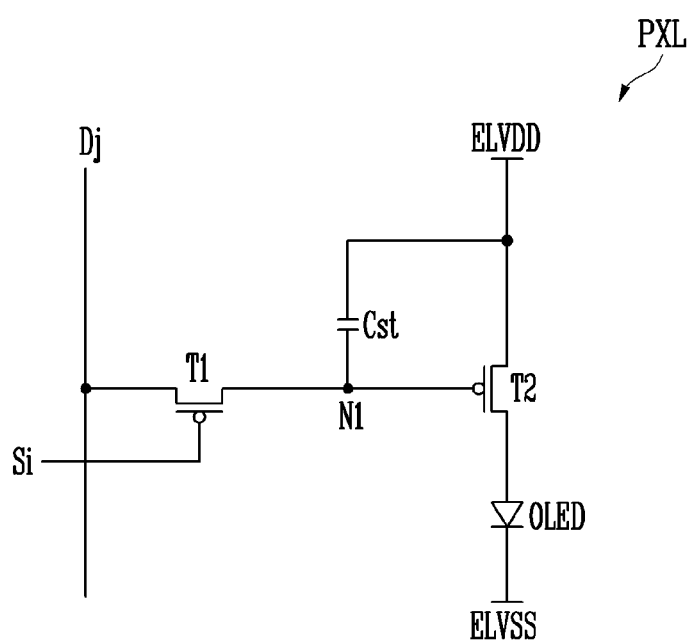
FIG. 4 is a diagram illustrating a configuration of a pixel PXL shown in FIG. 1.

FIG. 4 is a diagram illustrating a configuration of the pixel PXL shown in FIG. 1. For convenience of illustration and description, a pixel PXL coupled to an i-th (i is a natural number) scan line Si and a j-th (j is a natural number) data line Dj is illustrated in FIG. 4.

Referring to FIG. 4, the pixel PXL may include a first transistor T1, a second transistor T2, a storage capacitor Cst, and an organic light emitting diode OLED.

The first transistor T1 may include a first electrode connected to the j-th data line Dj, a gate electrode connected to the i-th scan line Si, and a second electrode connected to a first node N1.

The first transistor T1 may be turned on when a scan signal is supplied thereto through the i-th scan line Si and the data signal received from the j-th data line Dj is supplied to the storage capacitor Cst through the turned-on first transistor T1.

The storage capacitor Cst may charge the voltage corresponding to the data signal.

The second transistor T2 may include a first electrode connected to the first power ELVDD, a second electrode connected to the organic light emitting diode OLED, and a gate electrode connected to the first node N1.

The second transistor T2 may control an amount of a current flowing from the first power ELVDD via the organic light emitting diode OLED to the second power ELVSS in response to the voltage value stored in the storage capacitor Cst.

The organic light emitting diode OLED may include a first electrode (an anode electrode) connected to the second electrode of the second transistor T2 and a second electrode (a cathode electrode) connected to the second power ELVSS.

The organic light emitting diode OLED may generate light corresponding to the amount of the current supplied from the second transistor T2.

The organic light emitting diode OLED may include an organic material which emits light of one or more primary colors, e.g., red, green and blue, and the OLED display 1 may display a desired image with a spatial sum of such primary colors.

In an exemplary embodiment, as shown in FIG. 4, the first electrode of each of the transistors T1 and T2 may be one of a source electrode and a drain electrode, and the second electrode of each of the transistors T1 and T2 may be the other of the source electrode and the drain electrode. In one exemplary embodiment, for example, when the first electrode is the source electrode, the second electrode may be the drain electrode.

In an exemplary embodiment, as shown in FIG. 4, the transistors T1 and T2 may be p-type metal-oxide-semiconductor ("PMOS") transistors, but not being limited thereto. Alternatively, the transistors T1 and T2 may be n-type metal-oxide-semiconductor ("NMOS") transistors.

FIG. 4 shows a structure of one exemplary embodiment of the pixel PXL, and exemplary embodiments of the pixel PXL of the invention is not limited to the above structure. In such embodiments, the pixel PXL may have a circuit structure capable of supplying a current to the organic light emitting diode OLED, and may be selected from any one of various structures currently known in the art.

In an alternative exemplary embodiment, the pixel PXL may further include an additional transistor and a capacitor for compensating the current supplied to the organic light emitting diode OLED in addition to the first transistor T1 and the second transistor T2 shown in FIG. 4.

The first power ELVDD may be a high voltage, and the second power ELVSS may be a low voltage.

Figure 5:
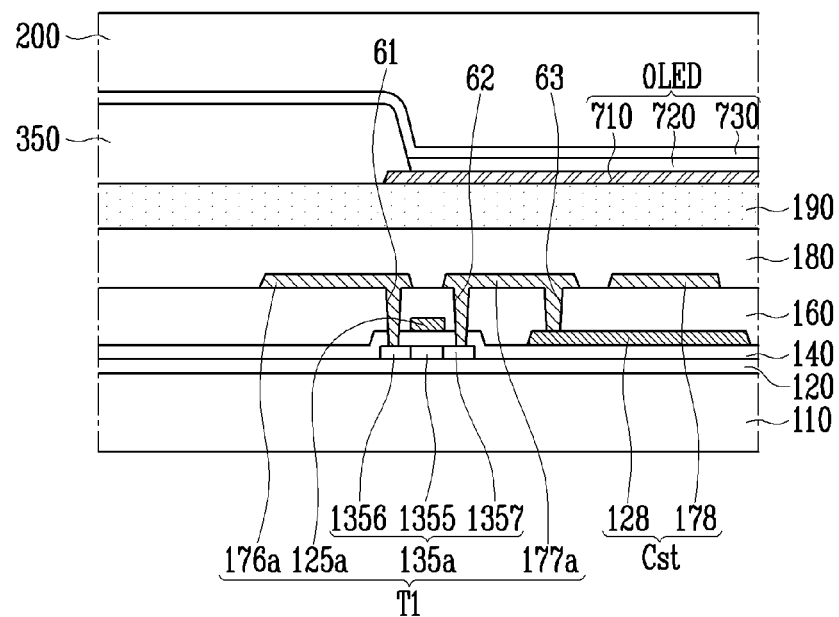
FIGS. 5 and 6 are cross-sectional views illustrating a structure of the pixel PXL shown in FIG. 4.
Figure 6:
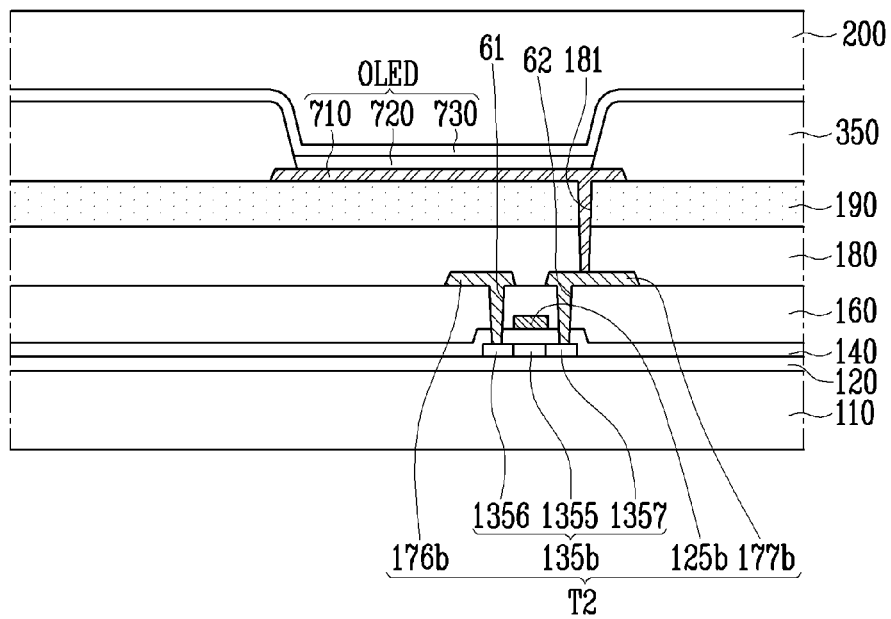

FIGS. 5 and 6 are cross-sectional views illustrating a structure of an exemplary embodiment of the pixel PXL shown in FIG. 4.

In an exemplary embodiment, as shown in FIGS. 5 and 6, the transistors T1 and T2 included in the pixel PXL shown in FIG. 4 may be thin film transistors on the substrate 110. The storage capacitor Cst and the organic light emitting diode OLED included in the pixel PXL may be disposed or stacked on the substrate 110.

In an exemplary embodiment, as described above with reference to FIGS. 2 and 3, the substrate 110 may include or be made of polyimide, polyamide, polyacrylates, or the like.

In such an embodiment, a buffer layer 120 including an inorganic material such as silicon oxide, silicon nitride, and/or silicon oxynitride may be disposed on the substrate 110.

The buffer layer 120 may provide a flat upper surface on the substrate 110, and may serve to prevent or minimize permeation of impurities through the substrate 110, into layers thereon, e.g., semiconductor layers 135a and 135b of the first transistor T1. The buffer layer 120 may have a single-layer structure or a multi-layer structure.

In an exemplary embodiment, although not shown in the drawings, a barrier layer may be further disposed on the substrate 110.

A first semiconductor layer 135a and a second semiconductor layer 135b may be disposed or formed on the buffer layer 120 to be separated from each other.

The first and second semiconductor layers 135a and 135b may include or be made of polysilicon or an oxide semiconductor.

The oxide semiconductor may include at least one selected from an oxide based on titanium (Ti), hafnium (Hf), zirconium (Zr), aluminum (Al), tantalum (Ta), germanium (Ge), zinc (Zn), gallium (Ga), tin (Sn), or indium (In), and a complex oxide thereof such as zinc oxide (ZnO), indium-gallium-zinc oxide (InGaZnO$_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

In an exemplary embodiment, where the semiconductor layers 135a and 135b are made of an oxide semiconductor, a separate passivation layer may be added to protect the oxide semiconductor that is vulnerable to an external environment, such as high temperature and the like.

Each of the first semiconductor layer 135a and the second semiconductor layer 135b may include a channel region 1355 in which impurities are not doped, and a source region 1356 and a drain region 1357 defined or formed by doping opposite sides of the channel region 1355 with impurities. The doped impurities may be selected depending on types of the thin film transistors, and may be n-type or p-type impurities.

The channel regions 1355 of the first semiconductor layer 135a and the second semiconductor layer 135b may include polysilicon that is not doped with impurities, that is, an intrinsic semiconductor.

In an exemplary embodiment, the source and drain regions 1356 and 1357 of the first semiconductor layer 135a and the second semiconductor layer 135b may include polysilicon that is doped with conductive impurities, that is, an impurity semiconductor.

A gate insulating layer 140 may be disposed or formed on the first semiconductor layer 135a and the second semiconductor layer 135b for securing insulation with the gate electrode. The gate insulating layer 140 may have a single-layer structure or a multi-layer structure including an inorganic material such as silicon oxide, silicon nitride, and/or silicon oxynitride.

A first gate electrode 125a, a first capacitor electrode 128 and a second gate electrode 125b may be disposed or formed on the gate insulating layer 140.

Although not shown in the drawings, a wire corresponding to the i-th scan line Si shown in FIG. 4 may be electrically connected to the first gate electrode 125a. The first capacitor electrode 128 and the second gate electrode 125b may be in a same layer, e.g., directly on the gate insulating layer 140, and connected to each other.

In an exemplary embodiment, the first gate electrode 125a, the first capacitor electrode 128, and the second gate electrode 125b on the gate insulating layer 140 may include or be made of a metal.

In such an embodiment, the metal may include molybdenum (Mo). Alternatively, and the metal may include at least one selected from gold (Au), silver (Ag), aluminum (Al), chromium (Cr), titanium (Ti), nickel (Ni), neodymium (Nd), copper (Cu), or an alloy thereof.

In an exemplary embodiment, each of the first gate electrode 125a, the first capacitor electrode 128, and the second gate electrode 125b may have a single-layer structure or be formed of a single layer, but not being limited thereto. Alternatively, each of the first gate electrode 125a, the first capacitor electrode 128, and the second gate electrode 125b may have a multi-layer structure or be formed of a multiple layer in which two or more materials of metals and alloys are stacked one on another.

Each of the first gate electrode 125a and the second gate electrode 125b overlaps the channel region 1355 when viewed from a plane view in a thickness direction of the substrate 110.

An interlayer insulating layer 160 may be disposed on the first gate electrode 125a, the first capacitor electrode 128, and the second gate electrode 125b.

The interlayer insulating layer 160 may include an inorganic material such as silicon oxide, silicon nitride, and/or silicon oxynitride.

A source contact hole 61 and a drain contact hole 62 may be defined or formed in the interlayer insulating layer 160 and the gate insulating layer 140 to expose the source region 1356 and the drain region 1357, respectively.

In an exemplary embodiment, a storage contact hole 63 may be defined or formed in the interlayer insulating layer 160 to expose a portion of the first capacitor electrode 128.

A first source electrode 176a, a second source electrode 176b, a second capacitor electrode 178, a first drain electrode 177a and a second drain electrode 177b may be disposed on the interlayer insulating layer 160.

In an exemplary embodiment, the electrodes (or the wires) disposed on the interlayer insulating layer 160 may include or be made of a metal. In one exemplary embodiment, for example, the electrodes (or the wires) may be made of at least one selected from metals such as gold (Au), silver (Ag), aluminum (Al), molybdenum (Mo), chromium (Cr), titanium (Ti), nickel (Ni), neodymium (Nd), copper (Cu), or an alloy of metals. In such an embodiment, each of the electrodes (or the wires) may have a single-layer structure or be formed of a single layer, but not being limited thereto. Alternatively, each of the electrodes (or the wires) may have a multi-layer structure or be formed of a multiple layer in which two or more materials of metals and alloys are stacked one on another.

Although not shown in the drawings, such as a wire corresponding to the j-th data line Dj shown in FIG. 4 and connected to the first source electrode 176a, a wire for supplying the first power ELVDD shown in FIG. 4 and connected to the second capacitor electrode 178, and a wire for supplying the second power ELVSS, or the like may be further disposed on the interlayer insulating layer 160. In such an embodiment, the wires may include or be formed of a same material as the material of the first source electrode 176a, the second source electrode 176b, the second capacitor electrode 178, the first drain electrode 177a and the second drain electrode 177b.

Each of the first source electrode 176a and the second source electrode 176b may be connected to the source region 1356 through the source contact hole 61.

Each of the first drain electrode 177a and the second drain electrode 177b may be connected to the drain region 1357 through the drain contact hole 62.

In an exemplary embodiment, the first drain electrode 177a may extend to be electrically connected to the first capacitor electrode 128 through the storage contact hole 63 defined in the interlayer insulating layer 160. In such an embodiment, although not shown in the drawings, the first drain electrode 177a may be electrically connected to the second gate electrode 125b through a contact hole.

In an exemplary embodiment, the second capacitor electrode 178 may overlap the first capacitor electrode 128 when viewed from the plan view in the thickness direction of the substrate 110. Accordingly, in such an embodiment, the first capacitor electrode 128 and the second capacitor electrode 178 may form or collectively define the storage capacitor Cst with the interlayer insulating layer 160 as a dielectric material.

The first semiconductor layer 135a, the first gate electrode 125a, the first source electrode 176a and the first drain electrode 177a may form or collectively define a switching transistor T1.

The second semiconductor layer 135b, the second gate electrode 125b, the second source electrode 176b and the second drain electrode 177b may form or collectively define a driving transistor T2.

A passivation layer 180 may be disposed on the first source electrode 176a, the second source electrode 176b, the first drain electrode 177a and the second drain electrode 177b.

In an exemplary embodiment, the passivation layer 180 may be an inorganic insulating layer including or made of an inorganic material. In such an embodiment, the inorganic material may include polysiloxane, silicon nitride, silicon oxide, silicon oxynitride, or the like. Alternatively, the passivation layer 180 may be omitted.

A first protection layer 190 may be disposed or formed on the passivation layer 180.

The first protection layer 190 may be an organic insulating layer made of an organic material. The organic material may include an organic insulating material such as a polyacrylic compound, a polyimide compound, a fluorocarbon compound such as Teflon®, a benzocyclobutene compound, or the like.

A first pixel electrode 710 may be disposed or formed on the first protection layer 190.

The first pixel electrode 710 may include or be made of a transparent conductive material such as indium tin oxide ("ITO"), indium zinc oxide ("IZO"), zinc oxide (ZnO), indium oxide ($In_2O_3$), or the like, or a reflective metal such as lithium, calcium, lithium fluoride/calcium (LiF/Ca), lithium fluoride/aluminum (LiF/Al), aluminum (Al), silver (Ag), magnesium (Mg), gold (Au), or the like.

The first pixel electrode 710 may be electrically connected to the second drain electrode 177b of the second transistor T2 through a contact hole 181 defined in the passivation layer 180 and the first protection layer 190, and may function as an anode of the organic light emitting diode OLED.

A pixel definition layer 350 may be disposed or formed on an edge portion of the first protection layer 190 and the first pixel electrode 710. In an exemplary embodiment, the pixel definition layer 350 may include an opening which exposes the first pixel electrode 710. In such an embodiment, the pixel definition layer 350 may partition a pixel area for each pixel.

The pixel definition layer 350 may be an organic insulating layer including or made of an organic material. The organic material may include an organic insulating material such as a polyacryl-based compound, a polyimide-based compound, a fluorocarbon compound such as Teflon®, a benzocyclobutene compound, or the like.

An organic emission layer 720 may be disposed in the opening of the pixel definition layer 350.

The organic emission layer 720 may include a low-molecule material or a high-molecule material. The low-molecule material may include copper phthalocyanine ("CuPc"), N,N-Di(naphthalen-1-yl)-N,N-diphenyl-benzidine ("NPB"), tris-8-hydroxyquinoline aluminum ("Alq3"), or the like. These materials may be formed by using vacuum deposition. The high-molecule material may include poly(3, 4-ethylenedioxythiophene) ("PEDOT"), poly-phenylenevinylene ("PPV"), polyfluorene, or the like.

The organic emission layer 720 may include a red organic emission layer that emits red light, a green organic emission layer that emits green light, and a blue organic emission layer that emits blue light. The red organic emission layer, the green organic emission layer, and the blue organic emission layer are respectively disposed on a red pixel, a green pixel, and a blue pixel to display a color image.

Alternatively, a white organic emission layer that emits white light may be disposed on each of the red pixel, the green pixel and the blue pixel, and a red color filter, a green color filter or a blue color filter may be disposed in each pixel to display a color image.

A second pixel electrode 730 may be disposed on the pixel definition layer 350 and the organic emission layer 720.

The second pixel electrode 730 may include or be made of a metal layer such as silver (Ag), magnesium (Mg), aluminum (Al), platinum (Pt), palladium (Pd), gold (Au), nickel (Ni), neodymium (Nd), iridium (Ir), chromium (Cr), or the like and/or a transparent conductive layer such as ITO, IZO, zinc oxide (ZnO), indium tin zinc oxide ("ITZO"), or the like. In an exemplary embodiment of the invention, the second pixel electrode 730 may have a multi-layer structure or be formed of a multi-layer including a metal thin film, for example, a triple layer of ITO/Ag/ITO.

In an exemplary embodiment, as described above, the first pixel electrode 710 may be an anode electrode of the organic light emitting diode OLED and the second pixel electrode 730 may be a cathode electrode of the organic light emitting diode OLED.

However, in an alternative exemplary embodiment, the first pixel electrode 710 may be a cathode electrode, and the second pixel electrode 730 may be an anode electrode.

The first pixel electrode 710, the organic emission layer 720 and the second pixel electrode 730 form or collectively define the organic light emitting diode OLED.

An encapsulation layer 200 may be disposed on the second pixel electrode 730. The encapsulation layer 200 may serve to prevent oxygen and moisture from permeating into the organic light emitting diode OLED. The encapsulation layer 200 may include a plurality of inorganic layers (not shown) and/or a plurality of organic layers (not shown). In one exemplary embodiment, for example, the encapsulation layer 200 may include a plurality of unit encapsulation layers including the inorganic layer and the organic layer disposed on the inorganic layer.

Figure 7:
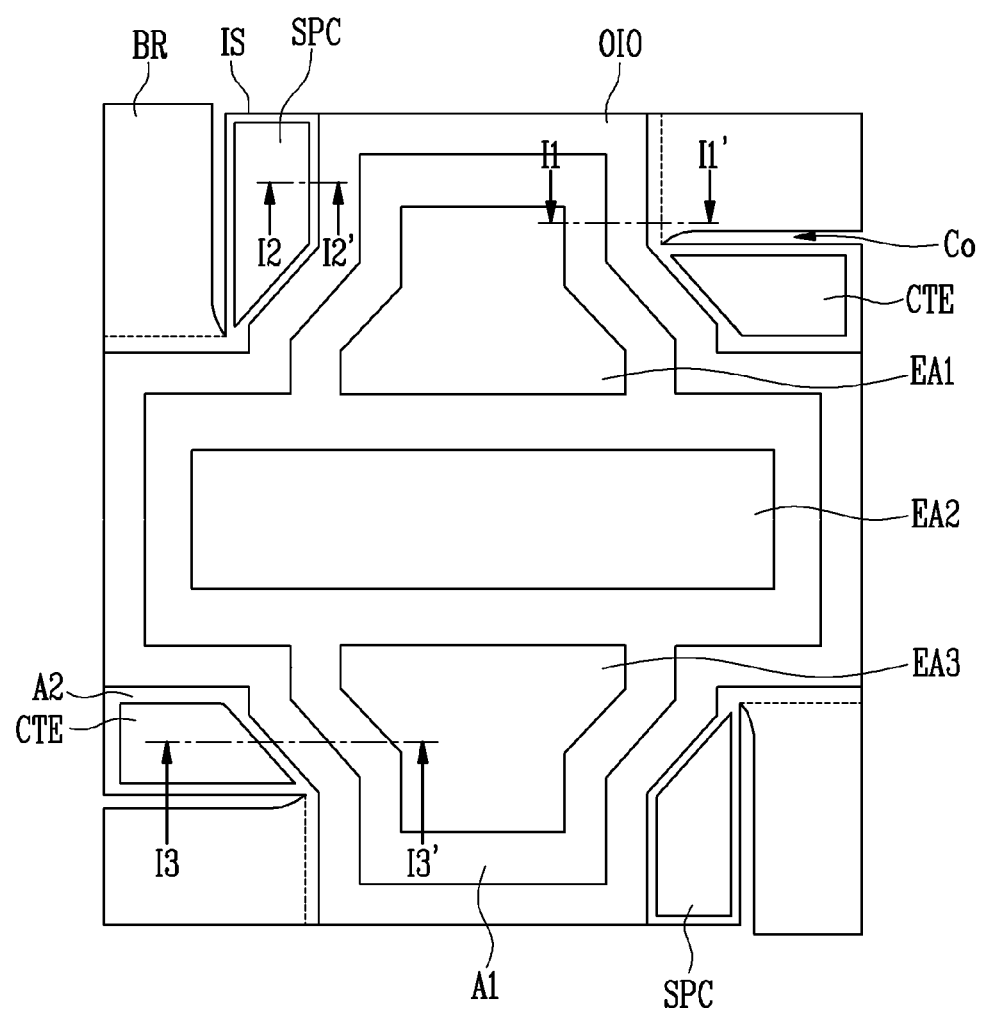
FIG. 7 is a plan view of configurations applied to an OLED display according to an exemplary embodiment of the invention.

FIG. 7 is a plan view of configurations applied to an OLED display according to an exemplary embodiment of the invention. For convenience of illustration and description, one of the plurality of islands IS and the bridges BR connected the one island IS are illustrated in FIG. 7. In addition, for convenience of illustration and description, light emitting areas EA1 to EA3 of each pixel PXL, an edge area OIO of the light emitting areas EA1 to EA3, spacers SPC, and contact electrodes CTE of structures disposed on the one island IS are illustrated in FIG. 7.

Referring to FIG. 7, a first light emitting area EA1, a second light emitting area EA2, and a third light emitting area EA3 may be defined in the island IS.

In an exemplary embodiment of an OLED display according to the invention, the plurality of pixels PXL may be disposed in each island IS. In one exemplary embodiment, for example, a pixel that emits red light, a pixel that emits blue light, and a pixel that emits green light may be disposed or provided in each island IS.

The first light emitting area EA1 may correspond to an organic emission layer of the pixel that emits red light. The second light emitting area EA2 may correspond to an organic emission layer of the pixel that emits blue light. The third light emitting area EA3 may correspond to an organic emission layer of the pixel that emits green light. A position and a shape of the light emitting areas EA1 to EA3 may be defined by the pixel definition layer 350.

In an exemplary embodiment, the first light emitting area EA1 and the third light emitting area EA3 may have a same shape as each other. In such an embodiment, the shapes of the first light emitting area EA1 and the third light emitting area EA3 may be symmetrical with each other. In such an embodiment, the first light emitting area EA1 may be arranged to be symmetrical with respect to the third light emitting area EA3 or an imaginary line extending in the first direction DR1 through a center of the third light emitting area EA3.

In an exemplary embodiment, as shown in FIG. 7, the first light emitting area EA1 and the third light emitting area EA3 may have a shape corresponding to the shape of a portion of the edge area OIO.

The second light emitting area EA2 may be located between the first light emitting area EA1 and the third light emitting area EA3. An area of the second light emitting area EA2 may be greater than an area of the first light emitting area EA1 or the third light emitting area EA3.

The island IS may include a first area A1 and a second area A2 separated by the edge area OIO.

The first area A1 may be an inner area of the edge area OIO. That is, the first area A1 may be surrounded by the edge area OIO. The first light emitting area EA1, the second light emitting area EA2, and the third light emitting area EA3 may be disposed in the first area A1.

The second area A2 may be an outer area of the edge area OIO. As shown in FIG. 7, the spacers SPC and the contact electrodes CTE may be disposed in the second area A2.

Hereinafter, the edge area OIO, the spacers SPC and the contact electrodes CTE shown in FIG. 7 will be described in detail with reference to FIGS. 8 and 9.

Figure 8:
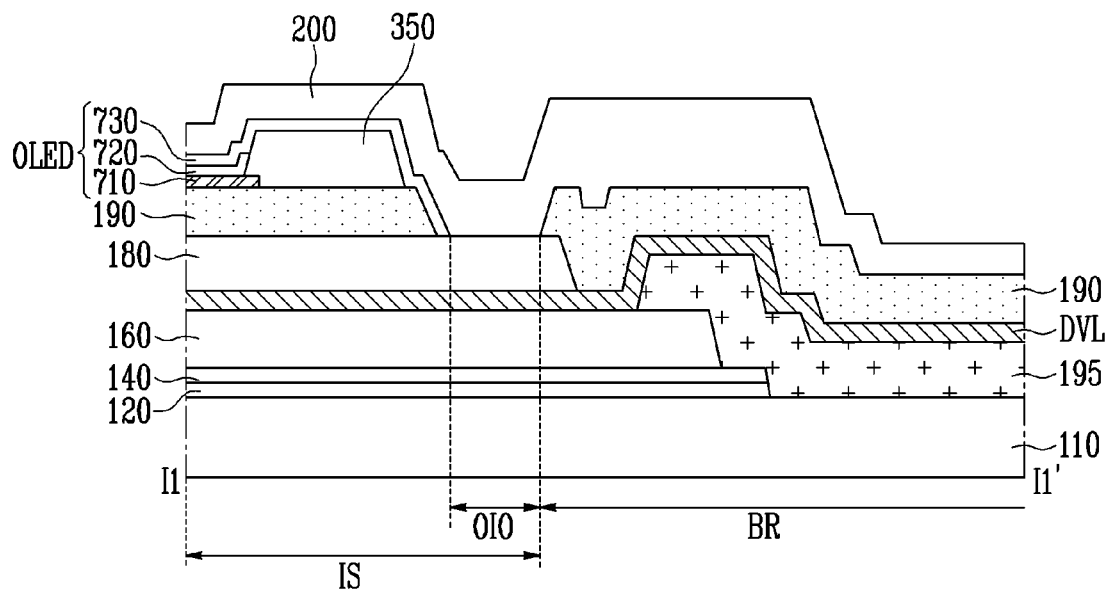
FIG. 8 is a cross-sectional view taken along line I1-I1' of FIG. 7.

FIG. 8 is a cross-sectional view taken along line I1-I1' of FIG. 7.

In an exemplary embodiment, as described above, wires for supplying a power source (e.g., the first power ELVDD and the second power ELVSS), a data signal, a scan signal, and the like to the pixel structure on the islands IS may be disposed on the bridges BR.

Referring to FIG. 8, a second protection layer 195 may be disposed on the bridge BR of the substrate 110.

The buffer layer 120, the gate insulating layer 140, and the interlayer insulating layer 160 may have an opening exposing the bridge BR of the substrate 110.

In such an embodiment, a most part of the buffer layer 120, the gate insulating layer 140, and the interlayer insulating layer 160 may be disposed on the island IS, and only a portion of the buffer layer 120, the gate insulating layer 140 and the interlayer insulating layer 160 may be disposed on the bridge BR.

The second protection layer 195 may cover the edges of the buffer layer 120, the gate insulating layer 140 and the interlayer insulating layer 160, which define the opening, and may cover the bridge BR exposed by the opening.

The second protection layer 195 may be an organic insulating layer including or made of an organic material. The organic material may include an organic insulating material such as a polyacryl-based compound, a polyimide-based compound, a fluorocarbon compound such as Teflon®, a benzocyclobutene compound, or the like.

A wire DVL may be disposed or formed on the second protection layer 195. Although only one wire DVL is illustrated in FIG. 8, a plurality of wires DVL may be provided on the bridge BR side by side when viewed in a plan view in a thickness direction of the substrate 110.

In an exemplary embodiment, the wire DVL disposed on the bridge BR may extend along a shape of the bridge BR. In such an embodiment, the wire DVL may extend to the island IS. The wire DVL extending to the island IS may be disposed on the interlayer insulating layer 160, and may be electrically connected to the transistor T1 and T2, the storage capacitor Cst or the organic light emitting diode OLED as described above.

In one exemplary embodiment, for example, the wire DVL extending from the bridge BR to the island IS may be electrically connected to some of the electrodes/wires disposed on the interlayer insulating layer 160 and may be electrically connected to some of the electrodes/wires disposed on the gate insulating layer 140.

The wire DVL may include or be formed of a same material as a material of the source electrode 176a and 176b of the transistor, a material of the second capacitor electrode 178, a material of the drain electrode 177a and 177b of the transistor or the like on the interlayer insulating layer 160.

The first protection layer 190 may include or be formed on the wire DVL. The first protection layer 190 disposed on the bridge BL may cover an edge of the passivation layer 180.

In an exemplary embodiment, one portion of the wire DVL may be protected by the first protection layer 190 and the remaining portion thereof may be protected by the passivation layer 180.

In an exemplary embodiment, the buffer layer 120, the gate insulating layer 140 and the interlayer insulating layer 160 including an inorganic material may be collectively referred to as an inorganic insulating layer. In such an embodiment, the first protection layer 190 and the second protection layer 195 may be collectively referred to as an organic material layer.

According to an exemplary embodiment of the invention, the inorganic insulating layer has the opening corresponding to the bridge BR, and the bridge BR has an organic material layer filling at least a portion of the opening.

In such an embodiment, the wire DVL may extend to the island IS via the bridge BR, and the wire DVL may be disposed on the organic material layer at the bridge BR. The wire DVL may be formed simultaneously with a source electrode or a drain electrode of a transistor during a same process by using a same material as the source or drain electrode.

An exemplary embodiment of the OLED display 1 according to the invention is stretchable. In such an embodiment, if the inorganic insulating layer does not have the opening in the bridge BR and has a continuous shape from the island IS to the bridge BR, the wire DVL may be disposed on the inorganic insulating layer at the bridge BR, and a large tensile stress is thereby applied to the wire DVL when the substrate 110 is stretched.

Particularly, since the inorganic insulating layer has a higher hardness than the organic material layer, there is a high probability that cracks and the like will occur in the inorganic insulation layer disposed in the bridge BR. When cracks and the like occur in the inorganic insulating layer, cracks and the like may also occur in the wire DVL on the inorganic insulating layer which may cause a high probability of occurrence of defects such as a disconnection of the wire DVL.

However, in an exemplary embodiment of the display device according to the invention, the inorganic insulating layer is mainly disposed on the island IS of the substrate 110, which is hardly stressed, and is disposed at a minimum on the bridge BR which is subject to stress when the substrate 110 is stretched, so that the wire DVL is disposed on the organic material layer at the bridge BR.

Since a hardness of the organic material layer is lower than a hardness of the inorganic insulating layer, the organic material layer may absorb tensile stress applied to the substrate 110, and therefore concentration of tensile stress on the wire DVL may be effectively minimized.

Herein, the electrodes/wires on the gate insulating layer 140 may be collectively referred to as a first conductive layer, and the electrodes/wires on the interlayer insulating layer 160 may be collectively referred to as a second conductive layer.

According to an exemplary embodiment of the invention, the wire DVL disposed on the bridge BR may include a same material as the material included in the second conductive layer.

According to an exemplary embodiment of the invention, the wire DVL disposed on the bridge BR includes a material having a high elongation or ductility such that a defect such as cracks or disconnection of the wire DVL may not occur or be effectively prevented.

In the island IS, the first conductive layer may include or be formed of a material having different electrical/physical characteristics from the wire DVL although the first conductive layer has a lower elongation than the wire DVL, thereby improving an efficiency of electrical signal transmission or reducing an incidence of defects in a manufacturing process.

In one exemplary embodiment, for example, the first conductive layer disposed on the island IS may include molybdenum, and the second conductive layer and the wire DVL may include aluminum.

In an exemplary embodiment of the invention, the second protection layer 195 may be disposed to cover the edge of the inorganic insulating layer and the bridge BR, and the wire DVL may be disposed on the second protection layer 195.

The wire DVL may be formed simultaneously with the second conductive layer (e.g., a source electrode or a drain electrode of a transistor) during a same process by using a same material as the second conductive layer. After forming a conductive layer on the entire surface of the substrate, the wire DVL may be formed by patterning the conductive layer.

For convenience of illustration and description, as shown in FIG. 8, an exemplary embodiment where the wire DVL disposed on the second protection layer 195 includes a single organic insulating layer, but not being limited thereto. In one alternative exemplary embodiment, for example, the second protection layer 195 may be in the form of a stack of a plurality of organic insulating layers, and at least one wire DVL may be disposed on each of the plurality of organic insulating layers. In such an embodiment, the wire DVL may be disposed on different organic insulating layers according to the width of the bridge BR and the number of wires connected to the pixel during a manufacturing process of the display device.

In a case where the organic material layer does not cover the edge of the inorganic insulating layer, a conductive material may remain in the buffer layer 120, the gate insulating layer 140, the interlayer insulating layer 160 and the like without being removed when patterning the conductive layer. The remaining conductive material may cause a short between other conductive layers.

Referring to FIG. 8, the edge area OIO adjacent to the bridge BR may be defined on the island IS. The edge area OIO may be an area where the first protection layer 190 and the second protection layer 195 are not provided.

The first protection layer 190 may include an opening corresponding to the edge area OIO. A portion of the passivation layer 180 may be exposed to an outside of the first protection layer 190 by the opening defined or formed in the first protection layer 190. At least a portion of the opening in the first protection layer 190 may be filled with the second pixel electrode 730 and the encapsulation layer 200.

Only the buffer layer 120, the gate insulating layer 140, the interlayer insulating layer 160 and the passivation layer 180 including an inorganic material may be disposed on the edge area OIO, and the first protection layer 190 and the second protection layer 195 may not be disposed on the edge area OIO. Accordingly, at least a part of the passivation layer 180 may be directly in contact with the encapsulation layer 200 in the edge area OIO as shown in FIG. 8. When the encapsulation layer 200 includes at least one inorganic layer and at least one organic layer, an inorganic layer may be the lowermost layer of the encapsulation layer 200 so that the inorganic layer of the encapsulation layer 200 is directly contacted with the passivation layer 180.

Figure 9:
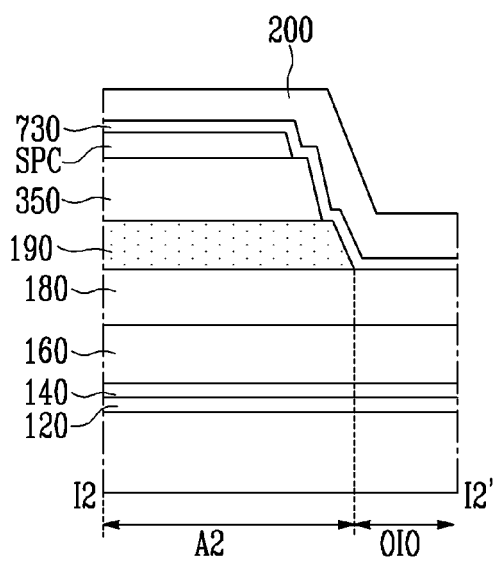
FIG. 9 is a cross-sectional view taken along line I2-I2' of FIG. 7.

FIG. 9 is a cross-sectional view taken along line I2-I2' of FIG. 7.

Referring to FIGS. 7 and 9, the spacers SPC may be disposed on the pixel definition layer 350, and may be positioned in the second area A2 which is the outer area of the edge area OIO.

The spacers SPC may be an organic insulating layer including or made of an organic material. The organic material may include an organic insulating material such as a polyacryl-based compound, a polyimide-based compound, a fluorocarbon compound such as Teflon®, a benzocyclobutene compound, or the like.

The spacers SPC may support a metal mask. The probability of occurrence of the defective pixel by the metal mask when the spacers SPC is located in the second area A2 is less than the probability of occurrence of the defective pixel by the metal mask when the spacers SPC are located in the first area A1. Thus, in such an embodiment, the probability of occurrence of a dark spot may be reduced.

Figure 10:
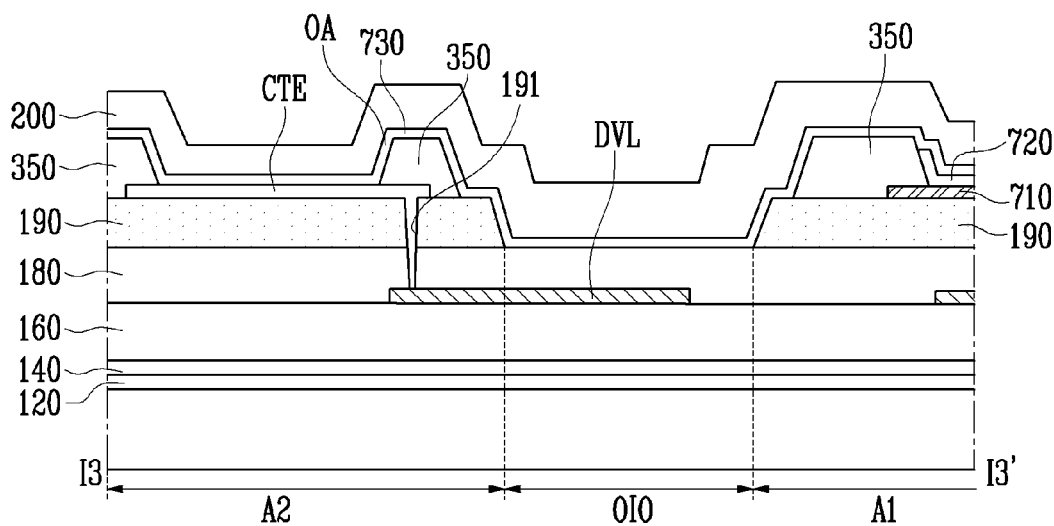
FIG. 10 is a cross-sectional view taken along line I3-I3' of FIG. 7.

FIG. 10 is a cross-sectional view taken along line I3-I3' of FIG. 7.

Referring to FIGS. 7 and 10, the contact electrodes CTE may be disposed on the first protection layer 190.

The pixel definition layer 350 may be disposed on the contact electrodes CTE. In such an embodiment, the pixel definition layer 350 may be disposed to cover an edge portion of the contact electrodes CTE and the first protection layer 190. The pixel definition layer 350 may have the opening OA exposing the contact electrodes CTE.

The second pixel electrode 730 may be disposed on the contact electrodes CTE and the pixel definition layer 350. A region of the contact electrodes CTE exposed by the pixel definition layer 350 may directly contact the second pixel electrode 730.

In an exemplary embodiment, the contact electrodes CTE may transmit the second power ELVSS to the second pixel electrode 730. The contact electrodes CTE may be connected to the wire DVL through a contact hole 191.

In such an embodiment, the second power ELVSS supplied to the wire DVL may be supplied to the second pixel electrode 730 through the contact electrodes CTE.

The second pixel electrode 730 disposed on the contact electrodes CTE may extend to a top surface of the organic emission layer 720 disposed in the first area A1 via the edge area OIO.

The contact electrodes CTE may include or be formed of a same material as the first pixel electrode 710.

Referring to FIG. 10, the passivation layer 180 may be in direct contact with the second pixel electrode 730 in at least a part of the edge area OIO.

As shown in FIGS. 7 and 10, the contact electrodes CTE may be disposed in the second area A2. However, the invention is not limited thereto, and alternatively, the contact electrodes CTE may be located in the first area A1.

Figure 11:
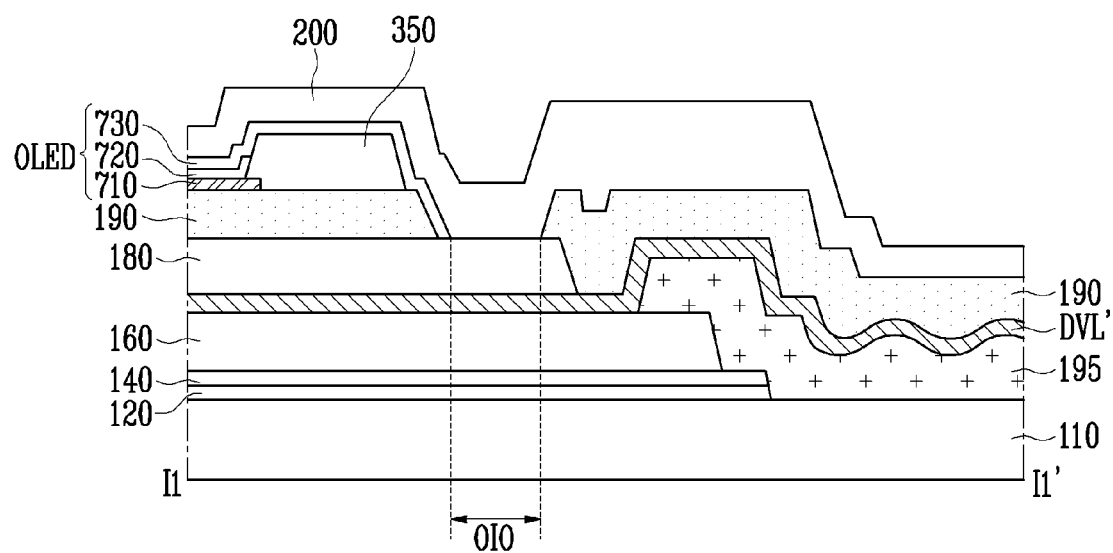
FIG. 11 is a view illustrating an alternative exemplary embodiment of a cross-sectional view taken along line I1-I1' of FIG. 7.

FIG. 11 is a view illustrating an alternative exemplary embodiment of a cross-sectional view taken along line I1-I1' of FIG. 7.

The cross-sectional view in FIG. 11 is substantially the same as the cross-sectional view shown in FIG. 8 except for the wire DVL'. The same or like elements shown in FIG. 11 have been labeled with the same reference characters as used above to describe the exemplary embodiments of the OLED display shown in FIGS. 7 and 8, and any repetitive detailed description thereof will hereinafter be omitted or simplified.

Referring to FIG. 11, in an exemplary embodiment, at least a part of the wire DVL' disposed on the bridge BR may have a curved shape, e.g., a shape of a wavy pattern. The wire DVL' may have a bent shape in a third direction perpendicular to the first direction DR1 and the second direction DR2.

Accordingly, in such an embodiment, the stress applied to the wire DVL' when the substrate 110 is stretched may be minimized.

Figure 12:
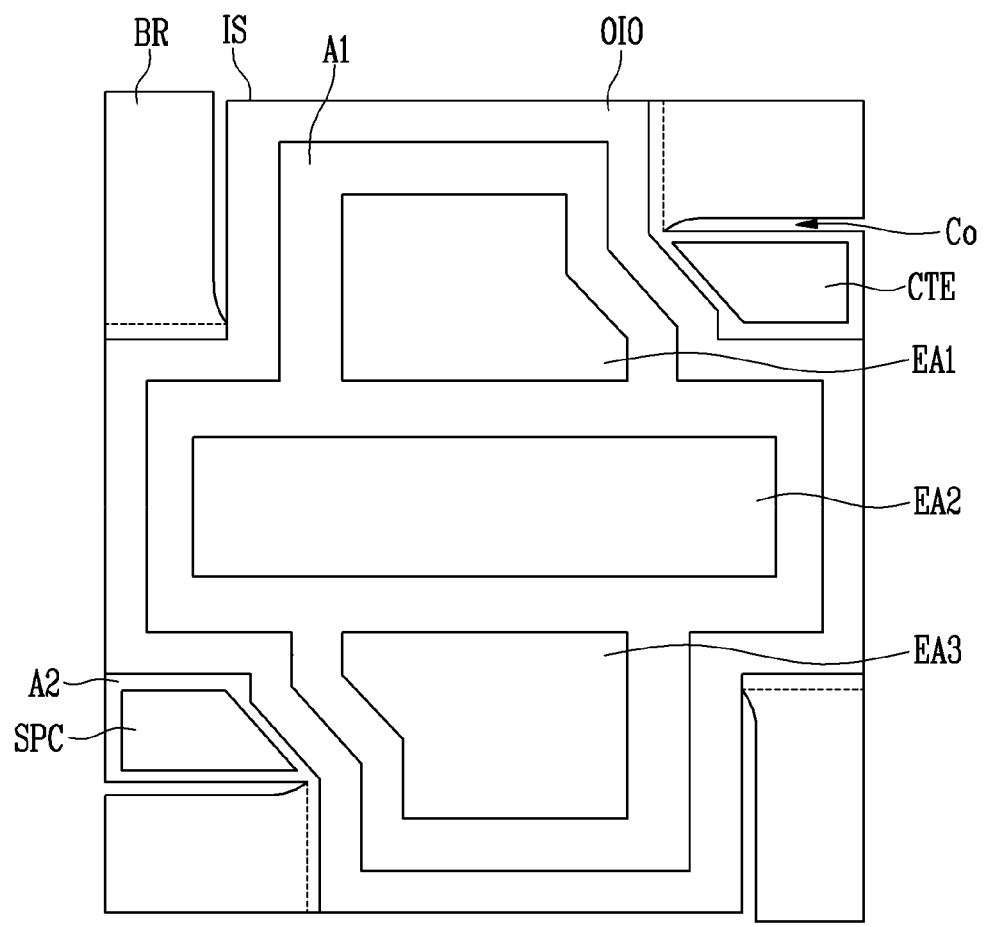
FIGS. 12 to 14 are plan views of a part of configurations of an OLED device according to an alternative exemplary embodiment of the invention.
Figure 13:
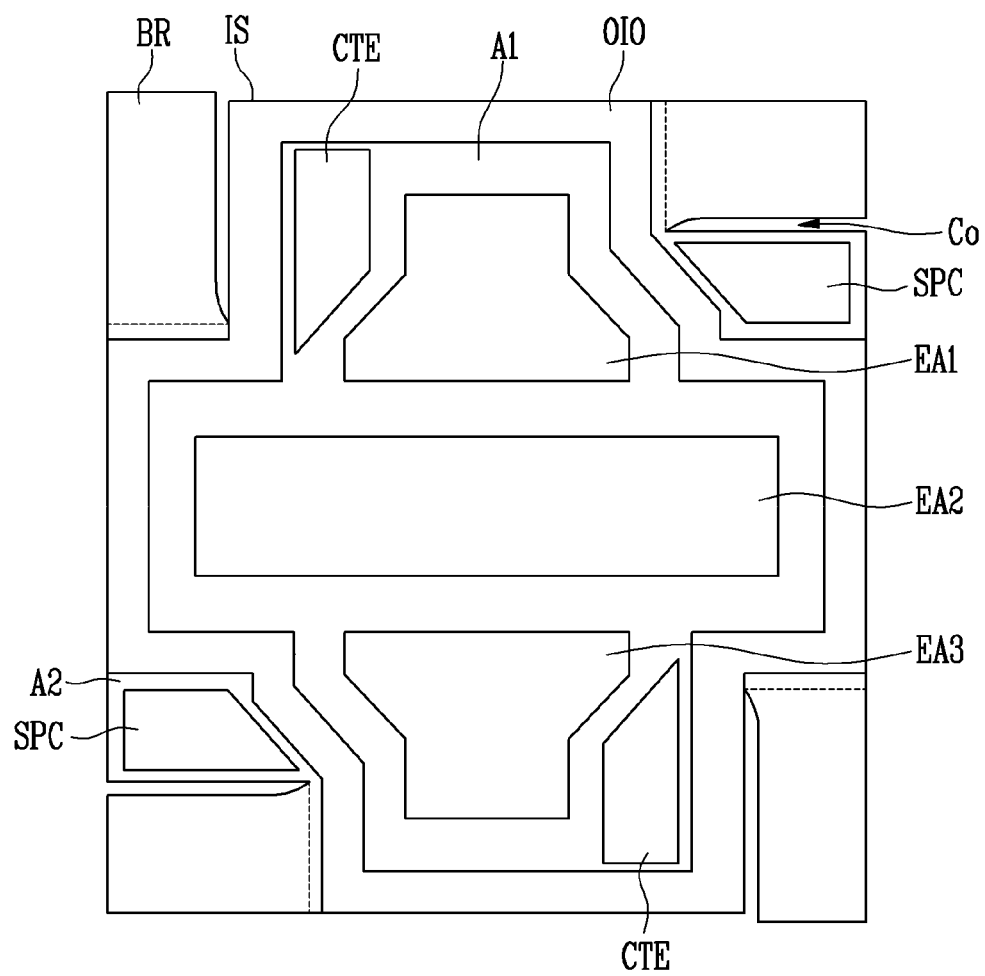
Figure 14:
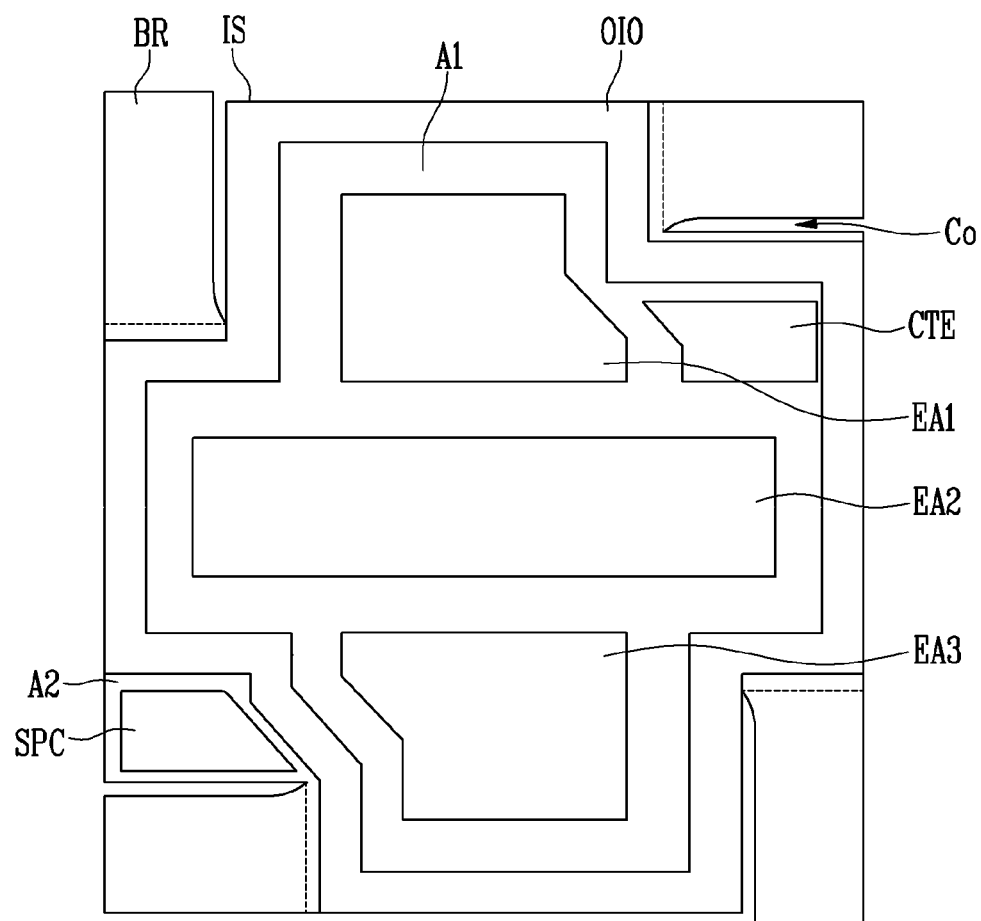

FIGS. 12 to 14 are plan views of a part of configurations of an OLED device according to an alternative exemplary embodiment of the invention.

The plan views in FIGS. 12 to 14 are substantially the same as the plan view shown in FIG. 7 except for the wire DVL' except for the spacers SCP and the contact electrodes CTE. The same or like elements shown in FIGS. 12 to 14 have been labeled with the same reference characters as used above to describe the exemplary embodiments of the OLED display shown in FIG. 7, and any repetitive detailed description thereof will hereinafter be omitted or simplified.

In FIGS. 12 to 14, exemplary embodiments where one island IS and the bridges BR connected thereto are illustrated for convenience of description as shown in FIG. 7. In addition, only the light emitting areas EA1 to EA3 of each pixel PXL, the edge area OIO, the spacers SPC and the contact electrodes CTE, among the configurations on the island IS, are illustrated in FIGS. 12 to 14.

Referring to FIG. 12, in an alternative exemplary embodiment, the first light emitting area EA1, the second light emitting area EA2, and the third light emitting area EA3 may be disposed in the first area A1 of the island IS.

In such an embodiment of an OLED display according to the invention, the plurality of pixels PXL may be disposed in each of the islands IS. In one exemplary embodiment, for example, the pixel PXL that emits red light (or displays a red color), the pixel PXL that emits blue light (or displays a blue color), and the pixel PXL that emits green light (or displays a green color) may be provided in each island IS.

The first light emitting area EA1 may correspond to an organic emission layer of the pixel PXL that emits red light. The second light emitting area EA2 may correspond to an organic emission layer of the pixel PXL that emits blue light.

The third light emitting area EA3 may correspond to an organic emission layer of the pixel PXL that emits green light.

The first light emitting area EA1 and the third light emitting area EA3 may have a same shape as each other. In one exemplary embodiment, for example, the first light emitting area EA1 and the third light emitting area EA3 may have a polygonal shape, as shown in FIG. 12. However, the invention is not limited thereto, and alternatively, the shapes of the first light emitting area EA1 and the third light emitting area EA3 may be variously modified according to the shape of the edge area OIO.

The second light emitting area EA2 may be located between the first light emitting area EA1 and the third light emitting area EA3. An area of the second light emitting area EA2 may be greater than an area of the first light emitting area EA1 or the third light emitting area EA3.

The spacers SPC and the contact electrodes CTE may be disposed in the second area A2.

In an exemplary embodiment, as shown in FIG. 12, a single spacer SPC and a single contact electrode CTE may be provided in each island IS.

In an alternative exemplary embodiment, the contact electrode CTE may be disposed in the first area A1 of the island IS as shown in FIGS. 13 and 14. However, as described above, in another alternative exemplary embodiment, the spacer SPC may be located in the second area A2, which is the outer side of the edge area OIO, to effectively prevent the defect by dark spots.

The invention should not be construed as being limited to the exemplary embodiments set forth herein. Rather, these exemplary embodiments are provided so that this disclosure will be thorough and complete and will fully convey the concept of the invention to those skilled in the art.

While the invention has been particularly shown and described with reference to exemplary embodiments thereof, it will be understood by those of ordinary skill in the art that various changes in form and details may be made therein without departing from the spirit or scope of the invention as defined by the following claims.

What is claimed is:

1. A display device comprising:
   a substrate including a plurality of islands and a plurality of bridges connecting the plurality of islands;
   a plurality of pixels disposed in each of the plurality of islands;
   a wire disposed in each of the plurality of bridges and connected to the plurality of pixels;
   a plurality of inorganic insulating layers stacked on the plurality of islands;
   a first organic insulating layer covering a part of the plurality of islands and the plurality of bridges, and
   an encapsulation layer disposed on the substrate,
   wherein the first organic insulating layer includes an opening, and
   wherein one of the plurality of inorganic insulating layers contacts the encapsulation layer through the opening.

2. The display device of claim 1, wherein each of the plurality of islands is divided into a first area, and an edge area surrounding the first area, and
   wherein the opening of the first organic insulating layer overlaps the edge area.

3. The display device of claim 2, further comprising:
   a second organic insulating layer on the plurality of bridges,
   wherein the wire is disposed on the second organic insulating layer, and wherein, in each of the plurality of bridges, the first organic insulating layer is disposed on the wire and the second organic insulating layer.

4. The display device of claim 2, wherein the plurality of inorganic insulating layers includes a first inorganic insulating layer, a second inorganic insulating layer, a third inorganic insulating layer, and a fourth inorganic insulating layer sequentially stacked one on another, and
wherein the first organic insulating layer covering a part of the fourth inorganic insulating layer.

5. The display device of claim 4, wherein each of the plurality of pixels includes a light emitting device, and the light emitting device comprises:
a first pixel electrode on the first organic insulating layer;
an emission layer on the first pixel electrode; and
a second pixel electrode on the emission layer, and
wherein the second pixel electrode fills at least a portion of the opening of the first organic insulating layer defined therein to correspond to the edge area.

6. The display device of claim 5, wherein the second pixel electrode contacts the fourth inorganic insulating layer in at least a part of the edge area.

7. The display device of claim 5, further comprising:
a contact electrode disposed on the first organic insulating layer and spaced apart from the first pixel electrode,
wherein the second pixel electrode is disposed on the contact electrode in a way such that at least a part of the contact electrode contacts the second pixel electrode.

8. The display device of claim 7, wherein the contact electrode is located outside of the edge area.

9. The display device of claim 7, wherein the contact electrode is located in the first area.

10. The display device of claim 7, wherein the contact electrode is electrically connected to the wire.

11. The display device of claim 2, further comprising:
a pixel definition layer which defines a light emitting region of each of the plurality of pixels; and
a spacer on the pixel definition layer,
wherein the pixel definition layer is disposed on the first organic insulating layer in the plurality of the islands.

12. The display device of claim 11, wherein each of the plurality of islands is further includes a second area located outside of the edge area, and
wherein the spacer is located in the second area.

13. The display device of claim 11, wherein the light emitting region is located in the first area.

14. The display device of claim 2, wherein the plurality of pixels comprises:
a first pixel which displays a first color;
a second pixel which displays a second color; and
a third pixel which displays a third color.

15. The display device of claim 14, wherein a light emitting region of the second pixel is located between a light emitting region of the first pixel and a light emitting region of the third pixel.

16. The display device of claim 14, wherein an area of a light emitting region of the second pixel is greater than an area of a light emitting region of the first pixel or the third pixel.

17. The display device of claim 14, wherein a shape of a light emitting region of the first pixel is the same as a shape of a light emitting region of the third pixel.

18. The display device of claim 2, wherein at least a part of the wire located in the bridge has a curved shape.

19. A display device comprising:
a substrate including a plurality of islands and a plurality of bridges connecting the plurality of islands;
a plurality of pixels disposed in the plurality of islands, each of the pixels including a light emitting device;
a wire disposed in each of the plurality of bridges and connected to the plurality of pixels;
a plurality of inorganic insulating layers on the plurality of islands;
a first organic insulating layer covering the wire in the plurality of bridges; and
an encapsulation layer covering the light emitting device and the first organic insulating layer and contacting one of the plurality of inorganic insulating layers in each of the plurality of islands through an opening defined by opposing facing edges of the first organic insulation layer.

20. The display device of claim 19, wherein each of the pixels further includes a transistor,
wherein the one of the plurality of inorganic insulating layers is disposed on the transistor,
wherein the first organic insulating layer partially overlaps the one of the plurality of inorganic insulating layers, and
wherein the encapsulation layer contacts a portion of the one of the plurality of inorganic insulating layers exposed by the first organic insulating layer.

21. The display device of claim 20, further comprising:
a pixel definition layer which defines a light emitting region of each of the plurality of pixels,
wherein the pixel definition layer is disposed on the first organic insulating layer in the plurality of the islands.

22. The display device of claim 19, wherein the one of the plurality of inorganic insulating layers is disposed on the wire,
wherein the first organic insulating layer partially overlaps the one of the plurality of inorganic insulating layers, and
wherein the encapsulation layer contacts a portion of the one of the plurality of inorganic insulating layers exposed by the first organic insulating layer.

23. The display device of claim 19, further comprising:
a second organic insulating layer on the plurality of bridges,
wherein the wire is disposed on the second organic insulating layer.

24. A display device comprising:
a substrate including a plurality of islands and a plurality of bridges connecting the plurality of islands;
a plurality of pixels disposed in each of the plurality of islands;
a wire disposed in each of the plurality of bridges and connected to the plurality of pixels;
a plurality of inorganic insulating layers comprising a first inorganic insulating layer, a second inorganic insulating layer, a third inorganic insulating layer, and a fourth inorganic insulating layer stacked on the plurality of islands; and
a first organic insulating layer covering a part of the plurality of islands and the plurality of bridges; and
a second organic insulating layer on the plurality of bridges,
wherein the wire is disposed on the second organic insulating layer,
wherein the fourth inorganic insulating layer is disposed on the wire, and
wherein the first organic insulating layer is disposed on the fourth inorganic insulating layer and partially exposes the fourth inorganic insulating layer through an opening defined by opposing facing edges of the first organic insulation layer.

25. The display device of claim 24, wherein, in a plan view, the first organic insulating layer exposes the fourth inorganic insulating layer along an edge of the each of the plurality of islands.

* * * * *